(12) United States Patent
Ishikawa et al.

(10) Patent No.: US 9,246,469 B2
(45) Date of Patent: Jan. 26, 2016

(54) MANUFACTURING METHOD OF OSCILLATOR, MANUFACTURING METHOD OF CIRCUIT DEVICE AND THE CIRCUIT DEVICE

(71) Applicant: Seiko Epson Corporation, Tokyo (JP)

(72) Inventors: Masayuki Ishikawa, Suwa (JP); Yosuke Itasaka, Tatsuno (JP); Takehiro Yamamoto, Suwa (JP); Akihiro Fukuzawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/537,094

(22) Filed: Nov. 10, 2014

(65) Prior Publication Data

US 2015/0130547 A1 May 14, 2015

(30) Foreign Application Priority Data

Nov. 11, 2013 (JP) ................................. 2013-233039

(51) Int. Cl.
 *H03B 5/32* (2006.01)
 *G01R 31/28* (2006.01)
 *H03H 9/05* (2006.01)

(52) U.S. Cl.
 CPC .......... *H03H 9/0547* (2013.01); *G01R 31/2824* (2013.01); *H03B 5/32* (2013.01)

(58) Field of Classification Search
 CPC .............. H03B 5/30; H03B 5/32; H03B 5/36; H03B 5/362; H03B 5/364; H03L 1/00; G01R 31/2824
 USPC ............ 327/143; 331/44, 65, 116 FE, 116 M, 331/116 R, 154, 158, 185, 186
 See application file for complete search history.

(56) References Cited

U.S. PATENT DOCUMENTS

| | | | | |
|---|---|---|---|---|
| 5,126,695 A * | 6/1992 | Abe | ................................ | 331/46 |
| 5,369,377 A * | 11/1994 | Benhamida | ..................... | 331/49 |
| 5,517,109 A * | 5/1996 | Albean et al. | .............. | 324/750.3 |
| 6,617,756 B1 | 9/2003 | Uchiyama | | |
| 6,782,485 B2 * | 8/2004 | Takai | ........................... | 713/500 |
| 7,378,780 B2 * | 5/2008 | Mizumura et al. | ............ | 310/341 |
| 7,768,357 B2 | 8/2010 | Yamakawa | | |
| 7,821,348 B2 | 10/2010 | Ishimaru et al. | | |
| 8,143,961 B2 * | 3/2012 | Mastovich | ..................... | 331/158 |
| 8,461,934 B1 * | 6/2013 | Carnu et al. | ..................... | 331/46 |
| 8,872,523 B2 * | 10/2014 | Sonnhueter et al. | ........... | 324/537 |

(Continued)

FOREIGN PATENT DOCUMENTS

| | | | |
|---|---|---|---|
| JP | 2001-007648 A | 1/2001 | |
| JP | 2001-094347 A | 4/2001 | |

(Continued)

*Primary Examiner* — Levi Gannon (74) *Attorney, Agent, or Firm* — Harness, Dickey & Pierce, P.L.C.

(57) ABSTRACT

A manufacturing method of an oscillator is a manufacturing method of an oscillator which includes a vibrator and a semiconductor circuit device including an oscillation part connected to the vibrator and a control part to switch an operation mode between a normal mode in which the oscillation part performs an oscillation operation and an inspection mode in which characteristics of the vibrator are inspected, and the manufacturing method includes preparing the semiconductor circuit device in which the operation mode is set to the inspection mode, connecting the semiconductor circuit device and the vibrator electrically, and inspecting the characteristics of the vibrator which is in a state electrically connected to the semiconductor circuit device.

6 Claims, 4 Drawing Sheets

(56) References Cited

U.S. PATENT DOCUMENTS

2008/0191756 A1* 8/2008 Li et al. ............... 327/147
2014/0132362 A1* 5/2014 Hsiao .................. 331/109

FOREIGN PATENT DOCUMENTS

| | | |
|---|---|---|
| JP | 2001-102870 A | 4/2001 |
| JP | 2004-120293 A | 4/2004 |
| JP | 2004-214799 A | 7/2004 |
| JP | 2004-328505 A | 11/2004 |
| JP | 2009-044606 A | 2/2009 |
| JP | 2009-164691 A | 7/2009 |
| JP | 2009-201097 A | 9/2009 |
| JP | 2010-062959 A | 3/2010 |

* cited by examiner

MANUFACTURING METHOD OF OSCILLATOR, MANUFACTURING METHOD OF CIRCUIT DEVICE AND THE CIRCUIT DEVICE

BACKGROUND

1. Technical Field

The present invention relates to a manufacturing method of an oscillator, a manufacturing method of a circuit device and the circuit device.

2. Related Art

An oscillator using a vibrator (piezoelectric vibrator), such as a crystal vibrator or a MEMS (Micro Electro Mechanical Systems) vibrator, is developed. Since there are manufacture variations in characteristics of the vibrator, the characteristics of the vibrator are required to be inspected by performing overdrive inspection, drive level characteristic inspection or the like.

JP-A-2001-7648 (Patent Literature 1) discloses a piezoelectric oscillator in which after a crystal vibrator and an oscillation circuit are mounted in the same container, the level characteristic inspection of the crystal vibrator can be performed.

In the piezoelectric oscillator disclosed in Patent Literature 1, the characteristics of the vibrator are required to be inspected after the oscillator is assembled and after the oscillation circuit is changed into an inspection mode. Thus, there is a problem that the time and the number of steps required for the inspection are increased. Besides, there is a problem that an equipment for changing the oscillation circuit into the inspection mode is also required.

SUMMARY

An advantage of some aspects of the invention is to provide a manufacturing method of an oscillator, a manufacturing method of a circuit device and the circuit device, in which time and the number of steps required for inspection can be reduced, and equipment investment can be suppressed.

APPLICATION EXAMPLE 1

This application example of the invention is directed to a manufacturing method of an oscillator including preparing a circuit device which includes an oscillation part connected to a vibrator and a control part to switch an operation mode between a normal mode in which the oscillation part performs an oscillation operation and an AC voltage application mode in which the oscillation part does not perform the oscillation operation and an AC voltage for driving the vibrator is applied to the vibrator, and in which the operation mode is set to the AC voltage application mode, connecting the vibrator and the oscillation part electrically, and applying, in a state where the AC voltage application mode is set, the AC voltage for driving the vibrator which is in a state electrically connected to the oscillation part.

According to this application example, since the operation mode of the control part of the circuit device is in the state set to the AC voltage application mode, when the AC voltage for driving the vibrator is applied, switching from the normal mode to the AC voltage application mode is not required. Thus, when the power supply voltage is supplied, the AC voltage applying can be performed quickly after the connecting. Besides, an equipment for changing the normal mode to the AC voltage application mode in order to apply the AC voltage for driving the vibrator is also not required. Accordingly, the manufacturing method of the oscillator can be realized in which for example, when voltage for inspecting the vibrator is applied as the AC voltage for driving the vibrator, the time and the number of steps required for the inspection can be reduced, and the equipment investment can be suppressed.

APPLICATION EXAMPLE 2

In the manufacturing method of an oscillator according to the application example described above, it is preferable that the AC voltage is at least one of a voltage for performing drive inspection and a voltage for performing drive level characteristic inspection.

Important characteristics of the vibrator in the state electrically connected to the circuit device can be inspected by applying, as the AC voltage, at least one of the voltage for performing drive inspection and the voltage for performing drive level characteristic inspection.

APPLICATION EXAMPLES 3 AND 4

In the manufacturing method of an oscillator according to the application example described above, it is preferable that the manufacturing method of an oscillator further includes switching the operation mode to the normal mode after the applying the AC voltage.

Since the oscillator becomes in a state capable of performing the normal oscillation operation by performing the switching, the manufacturing method of the oscillator can be realized in which the oscillator can be quickly used.

APPLICATION EXAMPLE 5

This application example of the invention is directed to a manufacturing method of a circuit device including forming a circuit which includes an oscillation part electrically connected to a vibrator and a control part to switch an operation mode between a normal mode in which the oscillation part performs an oscillation operation and an AC voltage application mode in which the oscillation part does not perform the oscillation operation and an AC voltage for driving the vibrator is applied to the vibrator, and setting the operation mode to the AC voltage application mode.

According to this application example, since the operation mode of the circuit device is in the state set to the AC voltage application mode, after an oscillator is assembled, the AC voltage, for example, voltage for performing drive inspection can be quickly applied to the vibrator in the state electrically connected to the circuit device, and characteristics of the vibrator can be inspected. Besides, an equipment for changing the normal mode to the AC voltage application mode in order to apply the AC voltage is also not required. Accordingly, the manufacturing method of the circuit device can be realized in which for example, when voltage for inspecting the vibrator is applied as the AC voltage for driving the vibrator, the time and the number of steps required for the inspection can be reduced, and the equipment investment can be suppressed.

APPLICATION EXAMPLE 6

This application example of the invention is directed to a semiconductor circuit device including an oscillation part electrically connected to a vibrator and a control part to switch an operation mode between a normal mode in which the oscillation part performs an oscillation operation and an AC voltage application mode in which the oscillation part does not operate and an AC voltage for driving the vibrator is applied to the vibrator, and the operation mode is set to the AC voltage application mode.

According to this application example, since the operation mode of the semiconductor circuit device is set to the AC voltage application mode, after an oscillator is assembled, the AC voltage, for example, voltage for performing drive inspection can be quickly applied to the vibrator in the state electrically connected to the semiconductor circuit device, and characteristics of the vibrator can be inspected. Besides, an equipment for changing the normal mode to the AC voltage application mode in order to apply the AC voltage is also not required. Accordingly, the semiconductor circuit device can be realized in which for example, when voltage for inspecting the vibrator is applied as the AC voltage for driving the vibrator, the time and the number of steps required for the inspection can be reduced, and the equipment investment can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. The drawings to be used are for convenience of the description. Incidentally, the embodiments described below do not unduly limit the contents of the invention set forth in the appended claims. Besides, all components described below are not necessarily inevitable components of the invention.

1. Semiconductor Circuit Device

Figure 1:
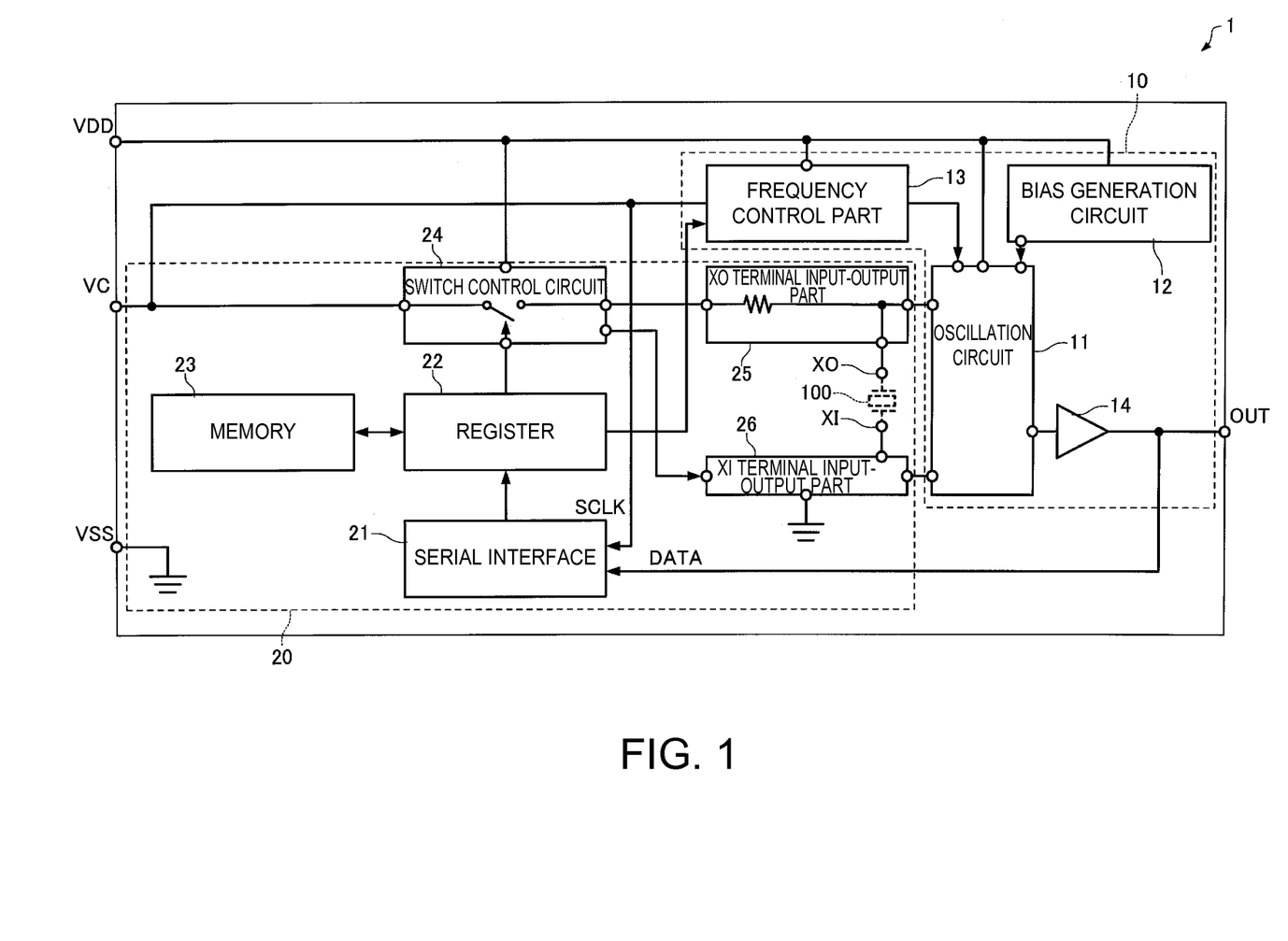
FIG. 1 is a circuit view of a semiconductor circuit device 1 of an embodiment.

FIG. 1 is a circuit view of a semiconductor circuit device 1 (example of a circuit device) of an embodiment.

The semiconductor circuit device 1 of the embodiment includes an oscillation part 10 electrically connected to a vibrator 100, and a control part 20 to switch an operation mode between a normal mode in which the oscillation part 10 performs an oscillation operation and an inspection mode (example of an AC voltage application mode) in which characteristics of the vibrator 100 are inspected. The operation mode is set to the inspection mode.

The oscillation part 10 is electrically connected to the vibrator 100 and performs the oscillation operation. In the example shown in FIG. 1, the oscillation part 10 includes an oscillation circuit 11, a bias generation circuit 12, a frequency control part 13 and an output buffer 14.

The oscillation circuit 11 is mainly electrically connected to the vibrator 100 and performs the oscillation operation. As the oscillation circuit 11, various well-known oscillation circuits such as, for example, a Pierce oscillation circuit, an inverter type oscillation circuit, a Colpitts oscillation circuit and a Hartley oscillation circuit can be adopted. In this embodiment, the oscillation circuit 11 is the Pierce oscillation circuit.

The bias generation circuit 12 generates a bias current based on power supplied from a power supply terminal VDD and supplies the bias current to the oscillation circuit 11. In this embodiment, the current is supplied to an oscillation transistor of the Pierce oscillation circuit.

The frequency control part 13 controls a variable capacitance included in the oscillation circuit 11 based on a control signal inputted to a control terminal VC. By this, the oscillation frequency can be controlled by changing the load capacitance of the oscillation circuit 11.

The output buffer 14 includes an amplifier circuit. The output buffer 14 receives input of the oscillation signal outputted by the oscillation circuit 11 and outputs the signal to an output terminal OUT.

The control part 20 controls the operation of the oscillation part 10. In the example shown in FIG. 1, the control part 20 includes a serial interface 21, a register 22, a memory 23, a switch control circuit 24, an XO terminal input-output part 25 and an XI terminal input-output part 26.

The serial interface 21 receives inputs of a clock signal SCLK and a data signal DATA, and controls the register 22 and the memory 23 based on the clock signal SCLK and the data signal DATA whose inputs are received. In this embodiment, the clock signal SCLK is inputted from the control terminal VC. Besides, the data signal DATA is inputted from the output terminal OUT. Besides, in this embodiment, the serial interface 21 includes a register write mode in which data is written in the register 22 and a memory write mode in which data is written in the register 22 and the memory 23.

The register 22 stores data for controlling the switch control circuit 24 and the frequency control part 13, and controls the switch control circuit 24 and the frequency control part 13 based on the stored data. At the energization of the semiconductor circuit device 1, the register 22 reads and stores the data stored in the memory 23. When new data is written by the serial interface 21, the register 22 stores the new data written by the serial interface 21.

The memory 23 stores the data stored in the register 22 at the energization of the semiconductor circuit device 1. The memory 23 may be constructed of various well-known nonvolatile memories which include rewritable nonvolatile memories such as an EEPROM (Electrically Erasable Programmable Read-Only Memory) and a flash memory, and non-rewritable nonvolatile memories such as a mask ROM (Read-Only Memory).

The switch control circuit 24 switches a connection state between the control terminal VC and the XO terminal input-output part 25 based on the data stored in the register 22. Besides, the switch control circuit 24 controls the XI terminal input-output part 26.

The XO terminal input-output part 25 connects an XO terminal electrically connected to a first terminal of the vibrator 100 and the oscillation circuit 11, and connects the XO terminal and the switch control circuit 24 through a resistor. The resistor provided between the XO terminal and the switch control circuit 24 functions as an ESD (Electro-Static Discharge) protection element for the vibrator 100.

The XI terminal input-output part 26 connects an XI terminal electrically connected to a second terminal of the vibrator 100 and the oscillation circuit 11. Besides, the XI terminal input-output part 26 switches a connection state between the XI terminal and the ground potential based on a control signal outputted by the switch control circuit 24.

The control part 20 includes, as an operation mode, a normal mode in which the oscillation circuit 11 is electrically connected to the vibrator 100 and operates as the oscillator, and an inspection mode in which characteristics of the vibrator 100 in a state electrically connected to the oscillation circuit 11 is inspected.

In the normal mode, the switch control circuit 24 turns off the connection state between the control terminal VC and the XO terminal input-output part 25. Besides, in the normal mode, the XI terminal input-output part 26 turns off the connection state between the XI terminal and the ground potential. Besides, in the normal mode, the frequency control part 13 performs a normal operation to control the variable capacitance included in the oscillation circuit 11.

In the inspection mode, the switch control circuit 24 turns on the connection state between the control terminal VC and the XO terminal input-output part 25. Besides, in the inspection mode, the XI terminal input-output part 26 turns on the connection state between the XI terminal and the ground potential. Besides, in the inspection mode, the frequency control part 13 operates to stop the oscillation.

In the inspection mode, a signal (AC voltage for driving the vibrator) can be inputted to the vibrator 100 not through the oscillation circuit 11 by using the control terminal VC and a ground terminal VSS. Accordingly, the characteristics of the vibrator 100 can be inspected in the state where the semiconductor circuit device 1 and the vibrator 100 are electrically connected to each other. As the inspection of the characteristics of the vibrator 100, there are, for example, an overdrive inspection (example of drive inspection) in which AC current, AC voltage or AC power larger than that in the normal mode is applied to drive the vibrator 100 and the frequency characteristic and the like of the vibrator 100 are inspected, and a drive level characteristic inspection in which AC current, AC voltage or AC power larger than that in the normal mode is stepwise increased or decreased, and the change of the frequency characteristic and the like of the vibrator 100 is inspected. As described above, since the control part 20 of the semiconductor circuit device 1 has the inspection mode, the important characteristics of the vibrator 100 can be inspected in the state where the semiconductor circuit device 1 and the vibrator 100 are electrically connected.

At the initial energization of the semiconductor circuit device 1, the operation mode of the control part 20 is set to the inspection mode. Specifically, data for setting the inspection mode is stored in the memory 23, and at the initial energization of the semiconductor circuit device 1, the data stored in the memory 23 is stored in the register 22. The switch control circuit 24, the XI terminal input-output part 26 and the frequency control part 13 are controlled to the inspection mode based on the data stored in the register 22.

According to the semiconductor circuit device 1 of the embodiment, since the operation mode of the semiconductor circuit device 1 is set to the inspection mode, the characteristics of the vibrator 100 in the state electrically connected to the semiconductor circuit device 1 can be quickly inspected after being assembled as the oscillator. Besides, an equipment for changing the normal mode to the inspection mode in order to perform the inspection is not required. Accordingly, the semiconductor circuit device 1 can be realized in which the time and the number of steps required for the inspection can be reduced, and the equipment investment can be suppressed.

The operation mode of the control part 20 of the semiconductor circuit device 1 of the embodiment can be changed after energization. Specifically, the clock signal SCLK from the control terminal VC and the data signal DATA from the output terminal OUT are inputted to the serial interface 21, and the serial interface 21 writes information relating to the operation mode into the register 22, so that the desired operation mode can be set. Besides, the serial interface 21 writes information relating to the operation mode into the memory 23, so that the operation mode to be set at the next energization can be set to the desired operation mode. Accordingly, for example, when the inspection of the vibrator 100 is ended and the oscillator is shipped, the operation mode to be set at the energization is set to the normal mode, so that the oscillator can be quickly used.

2. Manufacturing Method of the Semiconductor Circuit Device

Figure 2:
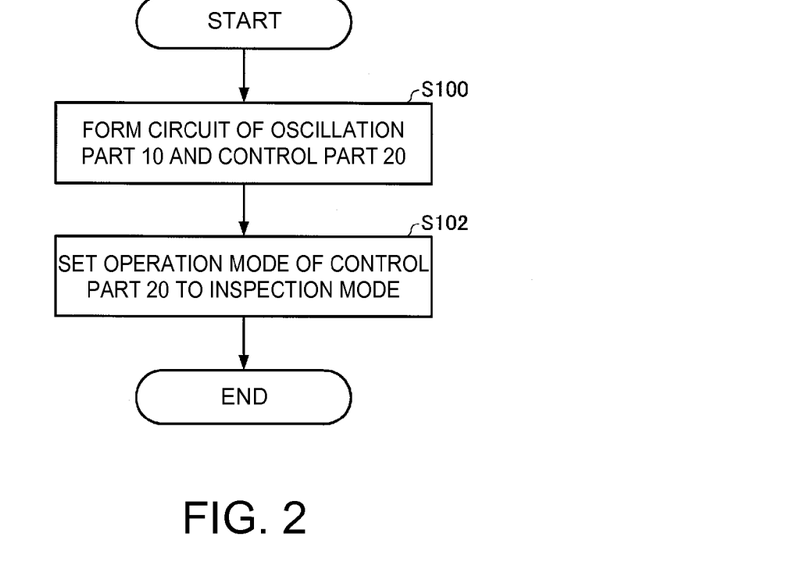
FIG. 2 is a flowchart showing a manufacturing method of the semiconductor circuit device 1 of the embodiment.

FIG. 2 is a flowchart showing a manufacturing method of the semiconductor circuit device 1 of the embodiment.

The manufacturing method of the semiconductor circuit device 1 of the embodiment is the manufacturing method of the semiconductor circuit device 1 which includes the oscillation part 10 electrically connected to the vibrator 100 and the control part 20 to control the operation mode including the normal mode in which the oscillation part 10 performs the oscillation operation and the inspection mode in which the vibrator 100 is inspected. The manufacturing method includes a circuit formation step (step S100) of forming a circuit of the oscillation part 10 and the control part 20, and a setting step (step S102) of setting the operation mode to the inspection mode. In the embodiment, the structure of the semiconductor circuit device 1 is the same as the structure described using FIG. 1.

In the manufacturing method of the semiconductor circuit device 1 of the embodiment, first, the circuit formation step of forming the circuit of the oscillation part 10 and the control part 20 is performed (step S100). Various well-known semiconductor manufacturing methods can be adopted as the circuit formation step.

After step S100, the setting step of setting the operation mode of the control part 20 to the inspection mode is performed (step S102). Specifically, for example, the clock signal SCLK from the control terminal VC and the data signal DATA from the output terminal OUT are inputted to the serial interface 21, and the serial interface 21 writes, as the operation mode, the information relating to the inspection mode into the memory 23.

According to the manufacturing method of the semiconductor circuit device 1 of the embodiment, since the operation mode of the semiconductor circuit device 1 is set to the inspection mode, the characteristics of the vibrator 100 in the state electrically connected to the semiconductor circuit device 1 can be quickly inspected after being assembled as the oscillator. Besides, an equipment for changing the normal mode to the inspection mode in order to perform the inspection is not required. Accordingly, the manufacturing method of the semiconductor circuit device 1 can be realized in which the time and the number of steps required for the inspection can be reduced, and the equipment investment can be suppressed.

3. Manufacturing Method of the Oscillator

Figure 3:
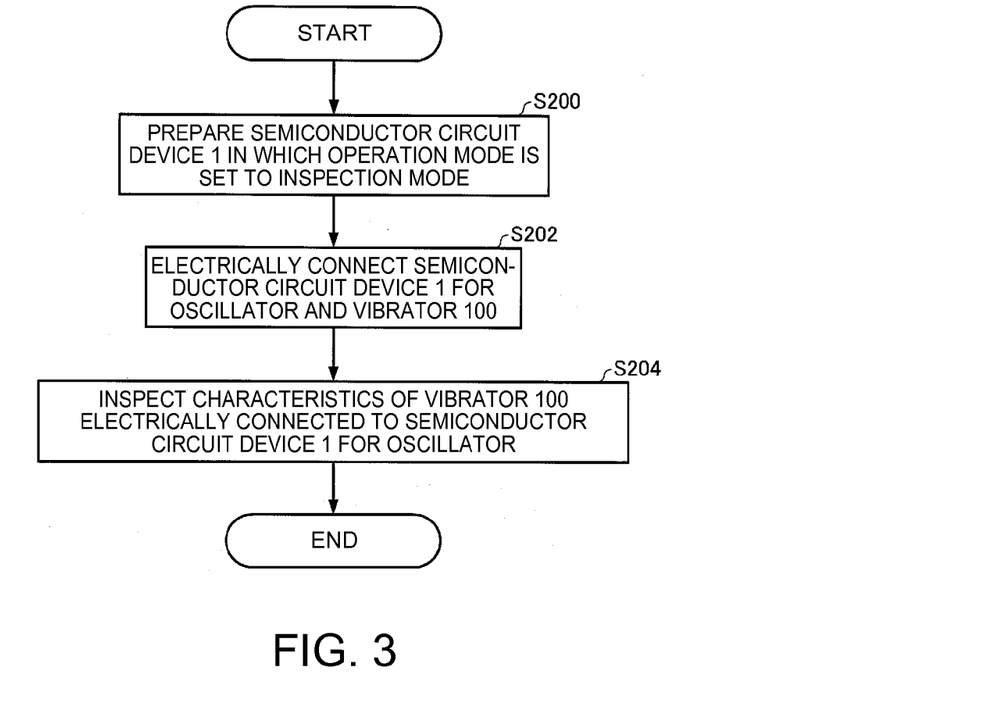
FIG. 3 is a flowchart showing a manufacturing method of an oscillator 1000 of an embodiment.

FIG. 3 is a flowchart showing a manufacturing method of an oscillator 1000 of an embodiment.

The manufacturing method of the oscillator 1000 of the embodiment is the manufacturing method of the oscillator which includes the vibrator 100 and the semiconductor circuit device 1 including the oscillation part 10 connected to the vibrator 100 and the control part 20 to control the operation mode including the normal mode in which the oscillation part 10 performs the oscillation operation and the inspection mode in which characteristics of the vibrator 100 are inspected. The manufacturing method includes a step (step S200) of preparing the semiconductor circuit device 1 in which the operation mode is set to the inspection mode, a connection step (step S202) of electrically connecting the semiconductor circuit device 1 and the vibrator 100, and an inspection step (step S204) of inspecting the characteristics of the vibrator 100 which is in the state electrically connected to the semiconductor circuit device 1. In this embodiment, the structure of the semiconductor circuit device 1 is the same as the structure described using FIG. 1.

In the manufacturing method of the oscillator 1000 of the embodiment, first, the semiconductor circuit device 1 in which the operation mode is set to the inspection mode is prepared (step S200). After step S200, the connection step (step S202) of electrically connecting the semiconductor circuit device 1 and the vibrator 100 is performed. Specifically, in FIG. 1, the first terminal of the vibrator 100 and the XO terminal are electrically connected, and the second terminal of the vibrator 100 and the XI terminal are electrically connected.

Figure 4:
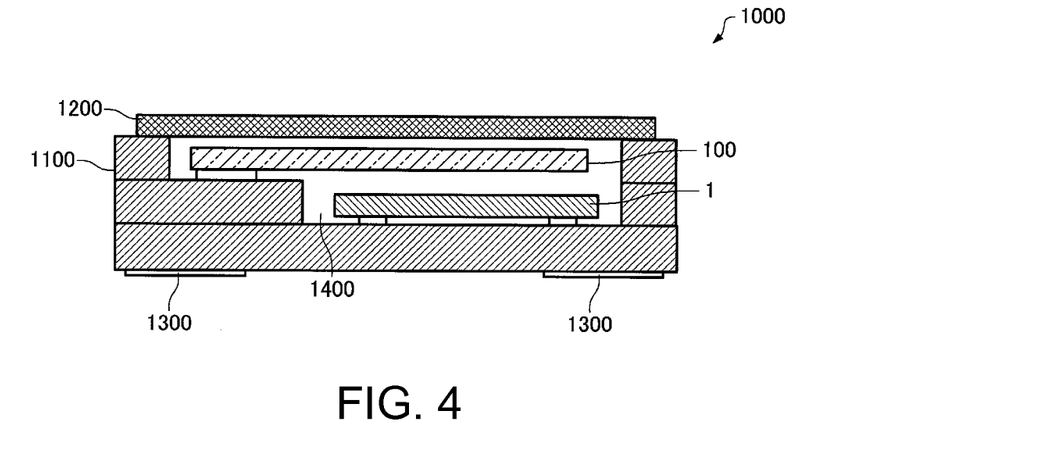
FIG. 4 is a sectional view of the oscillator 1000 of the embodiment.

FIG. 4 is a sectional view of the oscillator 1000 of the embodiment. The oscillator 1000 includes the semiconductor circuit device 1, the vibrator 100, a ceramic package 1100, a cover 1200 and electrodes 1300.

The ceramic package 1100 is provided with a concave part, and the cover 1200 covers the concave part so that a housing chamber 1400 is formed. In the ceramic package 1100, wirings and terminals for electrically connecting the semiconductor circuit device 1 and the vibrator 100 are provided on the surface of the concave part or inside the ceramic package 1100. Besides, the ceramic package 1100 is provided with the electrodes 1300 respectively electrically connected to the power supply terminal VDD, the ground terminal VSS, the control terminal VC and the output terminal OUT of the semiconductor circuit device 1.

In the connection step of step S200 of the embodiment, first, the semiconductor circuit device 1 is electrically connected to the terminals provided in the ceramic package 1100. Next, the vibrator 100 is electrically connected to the terminals provided in the ceramic package 1100. Next, the cover 1200 is bonded to the ceramic package 1100.

After step S202, the inspection step of inspecting the characteristics of the vibrator 100 which is in the state electrically connected to the semiconductor circuit device 1 is performed (step S204). In this embodiment, since the operation mode of the control part 20 of the semiconductor circuit device 1 is set to the inspection mode at the time of initial energization, the operation mode is the inspection mode at the time point when step S204 is performed.

Figure 5:
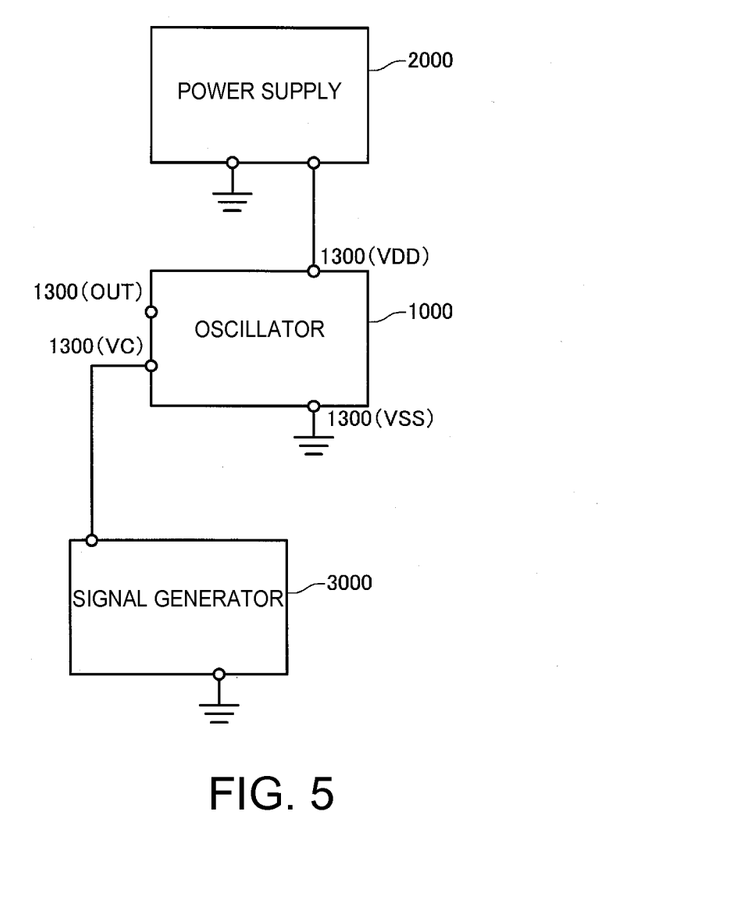
FIG. 5 is a block diagram showing the outline of an inspection process.

FIG. 5 is a block diagram showing the outline of the inspection step. In the example shown in FIG. 5, an overdrive test of the vibrator 100 is performed by using a power supply 2000 and a signal generator 3000.

The electrode 1300 (VDD) of the oscillator 1000 electrically connected to the power supply terminal VDD of the semiconductor circuit device 1 is connected to a power supply terminal of the power supply 2000. The electrode 1300 (VSS) of the oscillator 1000 electrically connected to the ground terminal VSS of the semiconductor circuit device 1 is connected to the ground potential. The electrode 1300 (VC) of the oscillator 1000 electrically connected to the control terminal VC of the semiconductor circuit device 1 is connected to an output terminal of the signal generator 3000. The electrode 1300 (OUT) of the oscillator 1000 electrically connected to the output terminal OUT of the semiconductor circuit device 1 is not connected to anywhere.

As shown in FIG. 5, according to the embodiment, since the operation mode of the semiconductor circuit device 1 is not required to be changed from the outside of the oscillator 1000 in order to perform the inspection step (step S204), the characteristics of the vibrator 100 can be inspected by a small number of parts, that is, the power supply 2000 and the signal generator 3000.

According to the embodiment, since the operation mode of the control part 20 of the semiconductor circuit device 1 is set to the inspection mode, change from the normal mode to the inspection mode is not required in order to perform the inspection. When power supply voltage is supplied, the inspection step (step S204) can be quickly performed after the connection step (step S202). Besides, an equipment for changing the normal mode to the inspection mode in order to perform the inspection is not required. Accordingly, the manufacturing method of the oscillator 1000 can be realized in which the time and the number of steps required for the inspection can be reduced, and the equipment investment can be suppressed.

In the manufacturing method of the oscillator 1000, the inspection performed at the inspection step (step S204) is preferably at least one of overdrive inspection and drive level characteristic inspection.

At the inspection step (step S204), at least one of the overdrive inspection and the drive level characteristic inspection is performed, so that the important characteristics of the vibrator 100 electrically connected to the semiconductor circuit device 1 can be inspected.

Figure 6:
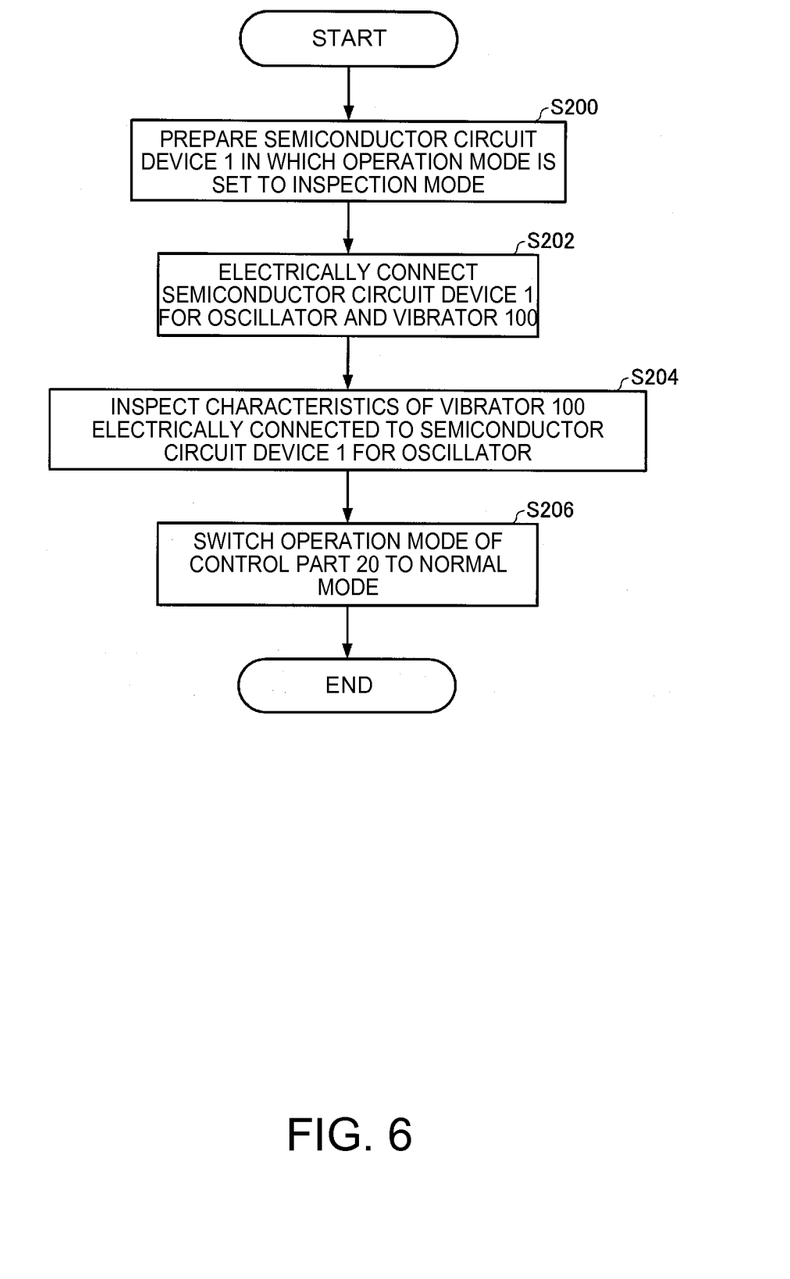
FIG. 6 is a flowchart showing a modified example of the manufacturing method of the oscillator 1000 of the embodiment.

FIG. 6 is a flowchart showing a modified example of the manufacturing method of the oscillator 1000 of the embodiment. The same steps as those of the flowchart shown in FIG. 3 are denoted by the same reference numerals and the detailed description thereof is omitted.

In the modified example of the manufacturing method of the oscillator 1000 of the embodiment, a switching step of switching the operation mode to the normal mode is further performed (step S206) after step S204. Specifically, for example, the clock signal SCLK from the control terminal VC and the data signal DATA from the output terminal OUT are inputted to the serial interface 21, and the serial interface 21 writes information relating to the normal mode as the operation mode into the memory 23.

When the switching step (step S206) is performed, a state occurs in which the normal oscillation operation of the oscillator 1000 can be performed. Accordingly, the manufacturing method of the oscillator 1000 can be realized in which the oscillator 1000 can be quickly used.

Although the embodiments or modified examples have been described, the invention is not limited to the embodiments or modified examples, and can be carried out in various modes within the scope not departing from the gist. For example, in the semiconductor circuit device 1 as an example of the circuit device, the oscillation part 10 and the control part 20 may be formed on separate semiconductor substrates. Further, circuits constituting the oscillation part 10 and the control part 20 may be formed on separate semiconductor circuit boards. Further, in the circuit device, a part or all of the circuits may be constructed of discrete type components or may be a combination thereof.

The invention includes substantially the same structure (for example, the same structure in function, method and result, or the same structure in object and effect) as the structure described in the embodiment. Besides, the invention includes the structure in which a portion not essential in the structure described in the embodiment is replaced. Besides, the invention includes the structure having the same operation and effect as the structure described in the embodiment or the structure in which the same object can be achieved. Besides, the invention includes the structure in which a well-known technique is added to the structure described in the embodiment.

The entire disclosure of Japanese Patent Application No. 2013-233039, filed Nov. 11, 2013 is expressly incorporated by reference herein.

What is claimed is:

1. A manufacturing method of an oscillator, comprising:
preparing a semiconductor circuit device, the semiconductor circuit device includes:
   a vibrator;
   an oscillation circuit that is electrically connected to the vibrator, that performs an oscillation operation of the vibrator in a first mode, and that has a variable capacity;
   a power supply terminal that supplies power to the oscillation circuit from outside of the semiconductor circuit device;
   a control terminal that supplies a control signal to the oscillation circuit from outside of the semiconductor circuit device in the first mode, the control signal controlling the variable capacity so as to control an oscillation frequency of the vibrator;
   a switch that switches between the first mode and a second mode different from the first mode; and
   a ground terminal that is connected to a ground potential; and
supplying an AC voltage to the vibrator via the control terminal in the second mode so as to drive the vibrator, wherein
the oscillation circuit is electrically disconnected to the vibrator when the AC voltage is supplied to the vibrator via the control terminal in the second mode.

2. The manufacturing method of the oscillator according to claim 1, wherein
the AC voltage is at least one of a voltage for performing drive inspection of the vibrator and a voltage for performing drive level characteristic inspection of the vibrator.

3. The manufacturing method of the oscillator according to claim 1, wherein
the switch switches the second mode to the first mode after supplying the AC voltage to the vibrator via ends of the control terminal.

4. The manufacturing method of the oscillator according to claim 2, wherein
the switch switches the second mode to the first mode after supplying the AC voltage to the vibrator via the control terminal ends.

5. A manufacturing method of a circuit device, comprising:
forming a semiconductor circuit device, the semiconductor circuit device includes:
   a vibrator;
   an oscillation circuit that is electrically connected to the vibrator, that performs an oscillation operation of the vibrator in a first mode, and that has a variable capacity;
   a power supply terminal that supplies power to the oscillation circuit from outside of the semiconductor circuit device;
   a control terminal that supplies a control signal to the oscillation circuit from outside of the semiconductor circuit device in the first mode, the control signal controlling the variable capacity so as to control an oscillation frequency of the vibrator;
   a switch that switches between the first mode and a second mode different from the first mode; and
   a ground terminal that is connected to a ground potential; and
supplying an AC voltage to the vibrator via the control terminal in the second mode so as to drive the vibrator, wherein
the oscillation circuit is electrically disconnected to the vibrator when the AC voltage is supplied to the vibrator via the control terminal in the second mode.

6. A circuit device comprising:
a vibrator; and
a semiconductor circuit device, the semiconductor circuit device includes:
   an oscillation circuit that is electrically connected to the vibrator, that performs an oscillation operation of the vibrator in a first mode, and that has a variable capacity;
   a power supply terminal that supplies power to the oscillation circuit from outside of the semiconductor circuit device;
   a control terminal that supplies a control signal to the oscillation circuit from outside of the semiconductor circuit device in the first mode, the control signal controlling the variable capacity so as to control an oscillation frequency of the vibrator;
   a switch that switches between the first mode and a second mode different from the first mode; and
   a ground terminal that is connected to a ground potential, wherein
an AC voltage is supplied to the vibrator via the control terminal in the second mode so as to drive the vibrator, and
the oscillation circuit is electrically disconnected to the vibrator when the AC voltage is supplied to the vibrator via the control terminal in the second mode.

* * * * *